US011153968B2

(12) United States Patent
Kong et al.

(10) Patent No.: US 11,153,968 B2
(45) Date of Patent: Oct. 19, 2021

(54) DEVICE, SYSTEM AND METHOD TO PROMOTE THE INTEGRITY OF SIGNAL COMMUNICATIONS

(71) Applicant: Intel Corporation, Santa Clara, CA (US)

(72) Inventors: Jackson Chung Peng Kong, Tanjung Tokong (MY); Bok Eng Cheah, Gelugor (MY); Khang Choong Yong, Puching (MY); Yun Ling, Portland, OR (US); Chia Voon Tan, Pinang (MY)

(73) Assignee: Intel Corporation, Santa Clara, CA (US)

( * ) Notice: Subject to any disclaimer, the term of this patent is extended or adjusted under 35 U.S.C. 154(b) by 794 days.

(21) Appl. No.: 15/841,880

(22) Filed: Dec. 14, 2017

(65) Prior Publication Data

US 2019/0045625 A1 Feb. 7, 2019

(51) Int. Cl.
*H05K 1/02* (2006.01)
*H05K 1/11* (2006.01)
*H05K 1/18* (2006.01)

(52) U.S. Cl.
CPC ......... *H05K 1/0245* (2013.01); *H05K 1/0225* (2013.01); *H05K 1/0251* (2013.01); *H05K 1/0253* (2013.01); *H05K 1/115* (2013.01); *H05K 1/18* (2013.01); *H05K 2201/0187* (2013.01); *H05K 2201/0195* (2013.01); *H05K 2201/09209* (2013.01); *H05K 2201/09263* (2013.01); *H05K 2201/10128* (2013.01)

(58) Field of Classification Search
CPC .. H05K 1/0245; H05K 1/0225; H05K 1/0251; H05K 1/0253; H05K 1/115; H05K 1/18
USPC ........................................................ 361/760
See application file for complete search history.

(56) References Cited

U.S. PATENT DOCUMENTS 4,977,105 A * 12/1990 Okamoto ............ H01L 23/5226
438/639

\* cited by examiner

*Primary Examiner* — Tremesha S Willis
(74) *Attorney, Agent, or Firm* — Green, Howard & Mughal LLP.

(57) ABSTRACT

Techniques and mechanisms for mitigating the effect of signal noise on communication via an interconnect. In an embodiment, a substrate includes an interconnect and a conductor which has a hole formed therein. Portions of the interconnect variously extend over a side of the conductor, wherein another recess portion of the interconnect extends from a plane which includes the side, and further extends at least partially into the hole. The configuration of the recess portion extending within the hole may contribute to an impedance which dampens a transmitter slew rate of the communication. In an embodiment, a total distance along a path formed by the interconnect is equal to or less than 5.5 inches.

25 Claims, 9 Drawing Sheets

200

210 — Forming a conductor including a side region which extends in a plane, including forming a sidewall structure which defines at least in part a hole extending from the plane and at least partially through the conductor

220 — Forming an interconnect comprising a first portion and a second portion, each disposed above the plane, and a recess portion, between the first portion and the second portion, which extends through the plane and into the hole

230 — Coupling the interconnect between a first circuit and a second circuit

240 — Providing a reference potential with the conductor

250 — While the reference potential is provided with the conductor, communicating a signal between the first circuit and the second circuit via the interconnect

FIG. 2

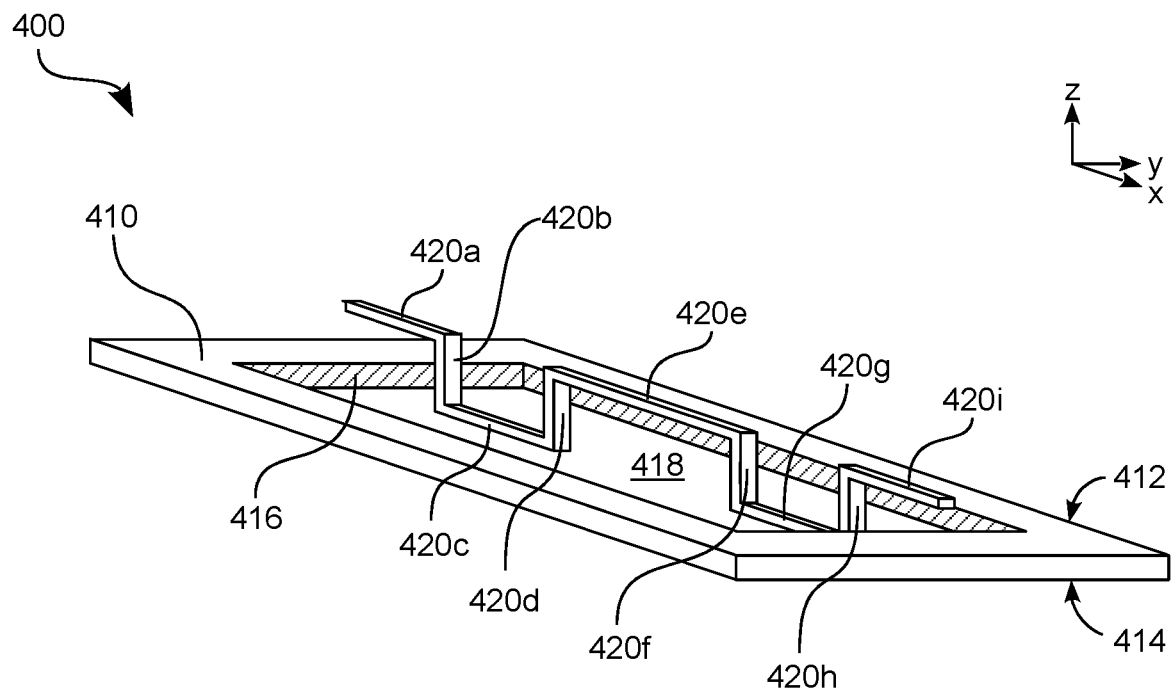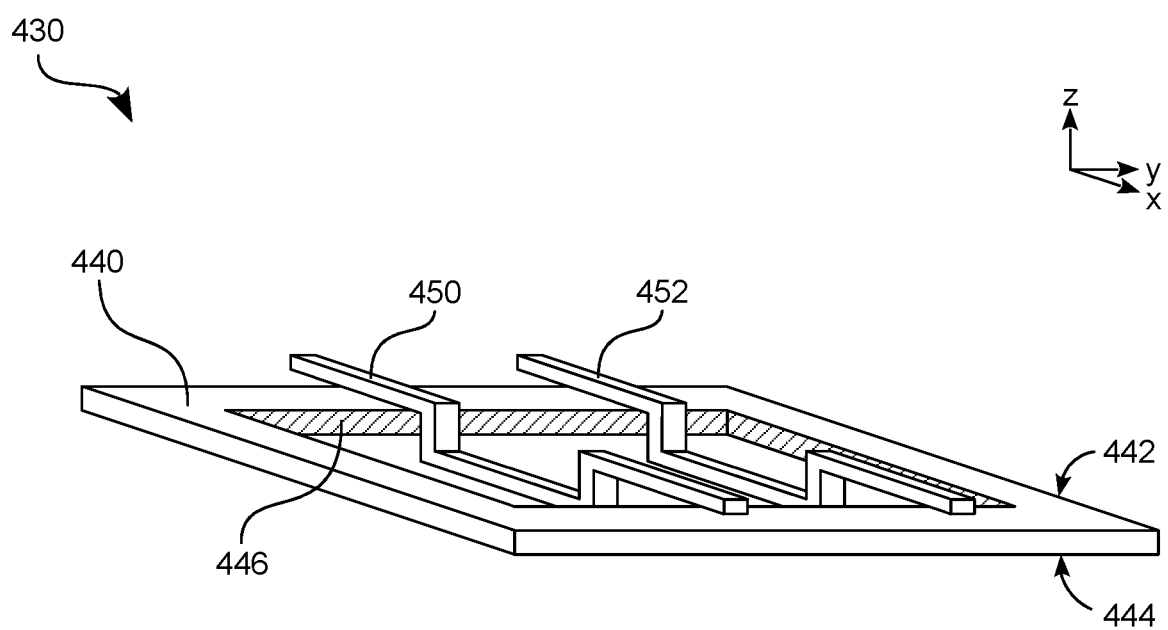
FIG. 4A

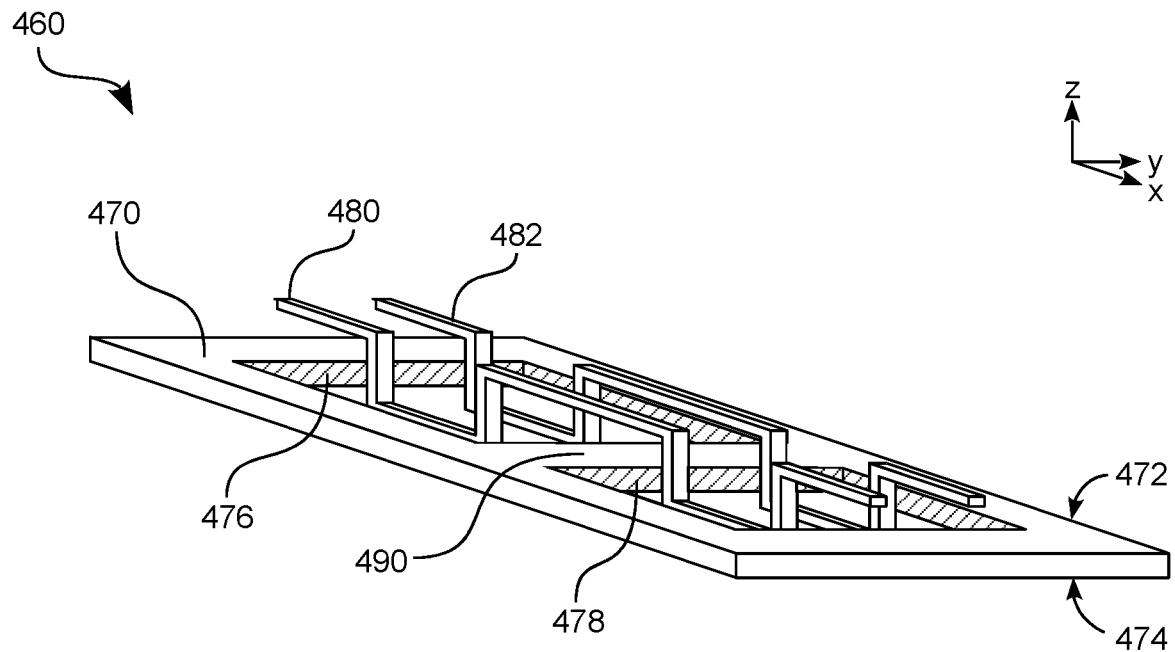
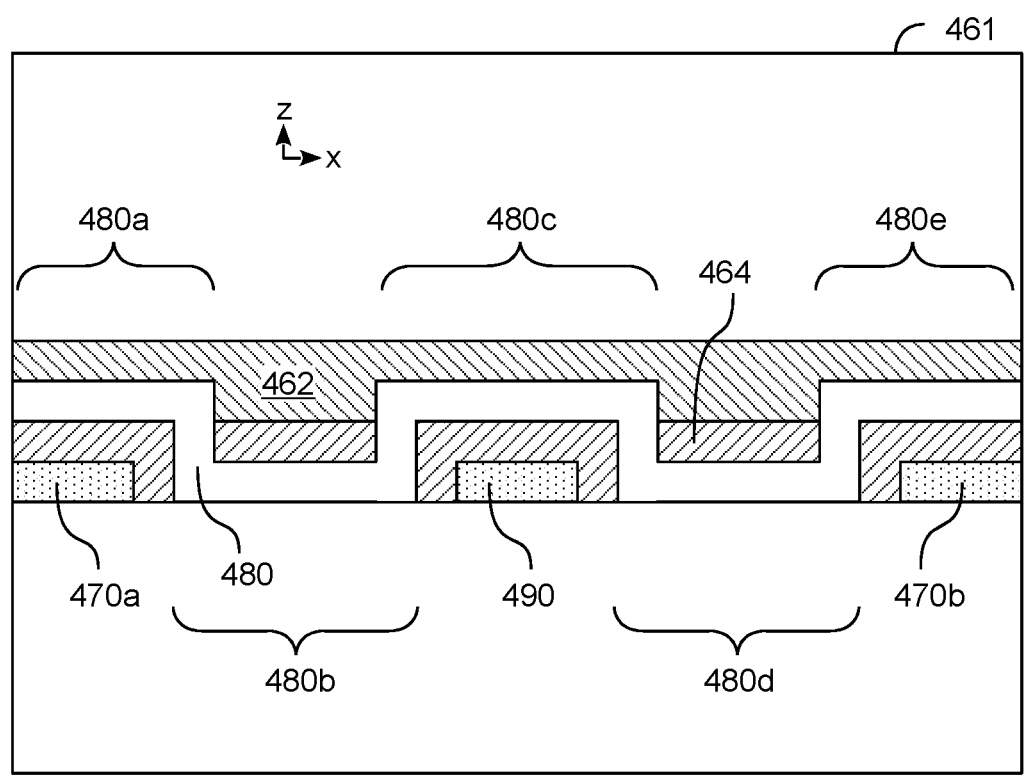
FIG. 4B

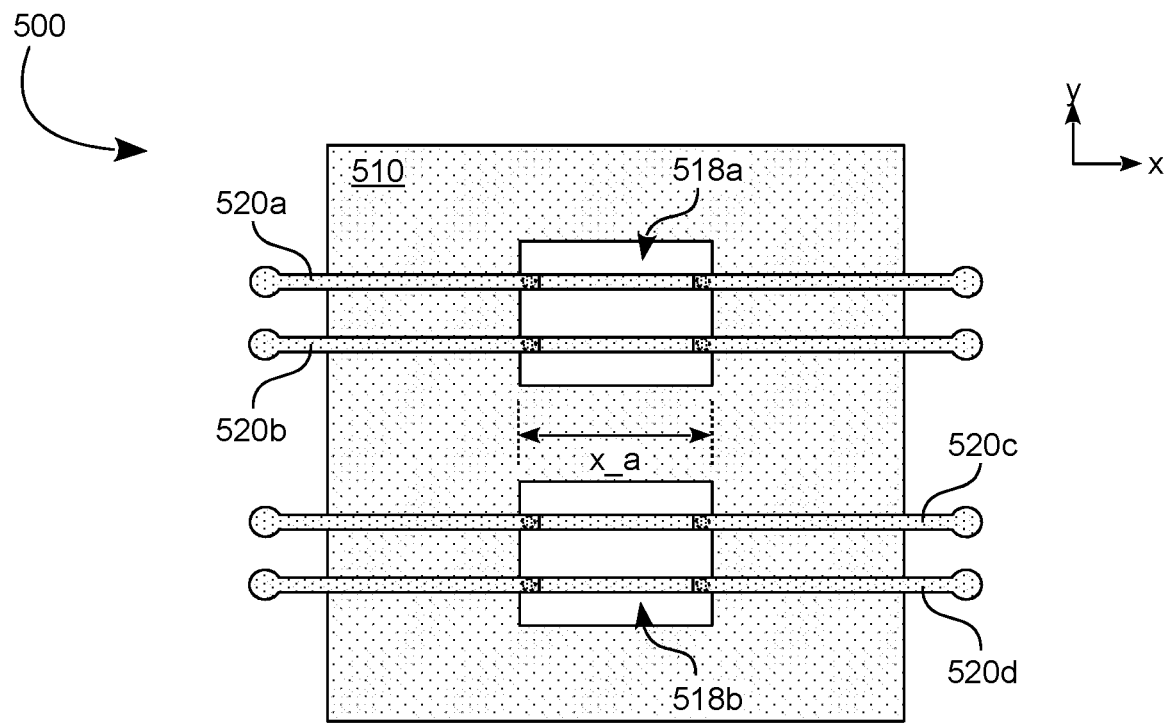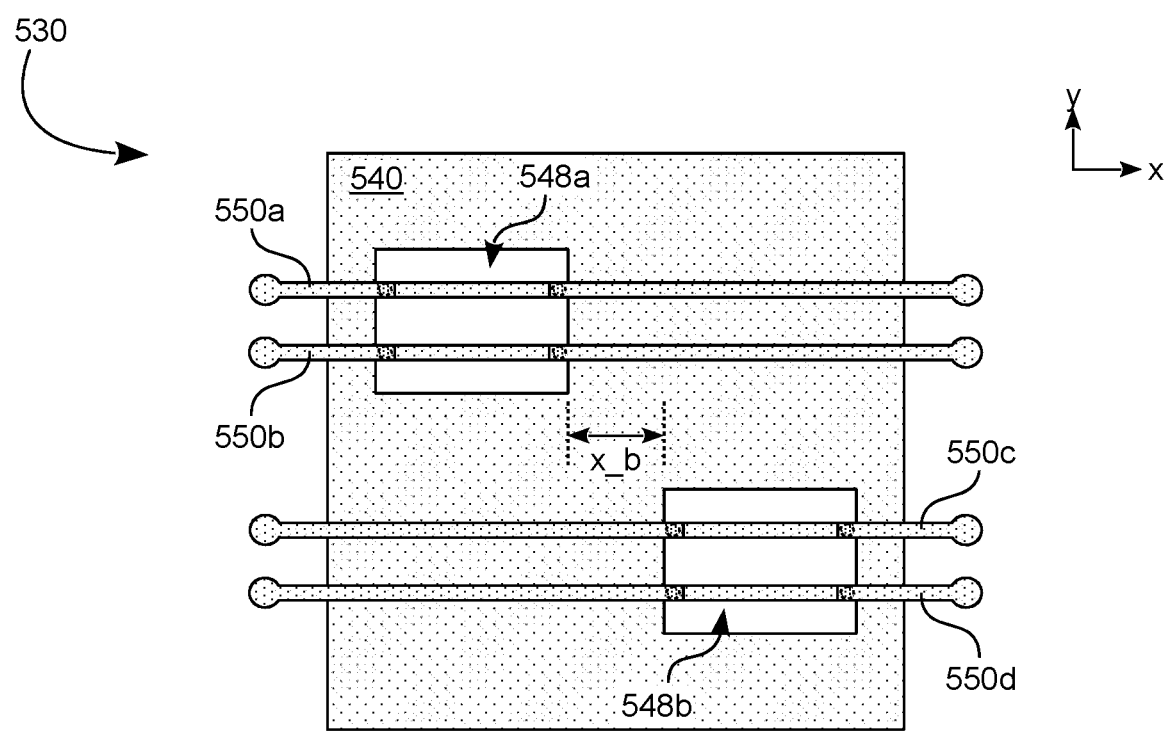
FIG. 5

DEVICE, SYSTEM AND METHOD TO PROMOTE THE INTEGRITY OF SIGNAL COMMUNICATIONS

BACKGROUND

1. Technical Field

Embodiments of the invention generally relate to structures that provide connectivity with a substrate and more particularly, but not exclusively, to structures to protect an integrity of signal communication.

2. Background Art

Digital signals are generally defined as signals that have two states (e.g., a high state and a low state) in which the voltage level of each of the states is within its own predetermined range. For example, a signal in a high state may have a voltage level equal to approximately Vcc, while a low voltage level may have a voltage equal to approximately Vss. Ideally, a transition between digital states occurs instantaneously, resulting in a vertical line that has an infinite slope. In actuality, a digital signal changes state over a specified period of time, providing a non-infinite slope that is equal to the time rate of change of the signal voltage. The time rate of change from one state to another state for a digital signal is defined as the slew rate, and it is typically measured in units of volts/time.

Excessive and/or non-linear slew rate, such as that caused by an over-amplified source circuit, typically results in double clocking, signal crosstalk coupling and/or other signal integrity complications. As successive generations of integrated circuit technologies continue to trend toward smaller scales and faster data rates, the sensitivity of such technology to slew rate characteristics is expected to increase. Accordingly, conventional techniques for mitigating the effects of poor slew rate are expected to be inadequate for the future demands of manufacturers.

BRIEF DESCRIPTION OF THE DRAWINGS

The various embodiments of the present invention are illustrated by way of example, and not by way of limitation, in the figures of the accompanying drawings and in which:

FIG. 2 is a flow diagram illustrating elements of a method to protect the integrity of signal communications according to an embodiment.

FIG. 4A shows perspective views each of a respective circuit device to promote the integrity of signal communications according to a corresponding embodiment.

FIG. 4B shows various views of a circuit device to promote the integrity of signal communications according to an embodiment.

FIG. 5 shows plan views each of a respective circuit device to promote the integrity of signal communications according to a corresponding embodiment.

DETAILED DESCRIPTION

Embodiments discussed herein variously provide techniques and mechanisms for protecting at least some signal integrity in a communication via an interconnect which extends over a ground plane or other such reference conductor. Newer input/output (I/O) interface technologies—e.g., those of 20 Gbps Thunderbolt connections or 10 Gbps USB 3.1 connections—support signaling of increasingly high frequencies and, often, impose minimum routing length restrictions in order to avoid signal noise. Such noise might result, for example, from signal reflection by high gain circuitry. The requirement of minimum routing lengths is expected to impose increasingly stringent constraint on the future scaling of circuit devices.

Some embodiments variously mitigate the effects of signal noise by providing an interconnect structure that undulates along a "vertical" (z-axis) dimension and extends into a hole formed by a conductor (referred to herein as a "reference voltage conductor") that is to be provided a ground voltage or other reference potential. A configuration of such an interconnect structure relative to a reference voltage conductor may result in an impedance increase that dampens a transmitter slew rate that might otherwise result (in the absence of such a recess portion extending into the hole), thus reducing noise due—for example—to signal reflection. By introducing a small lossiness of an interconnect—in high frequency, short channel applications—some embodiments variously increase channel margin over that which is provided, for example, by existing high-gain equalization circuitry designs.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including structures to interconnect circuit components.

Figure 1:
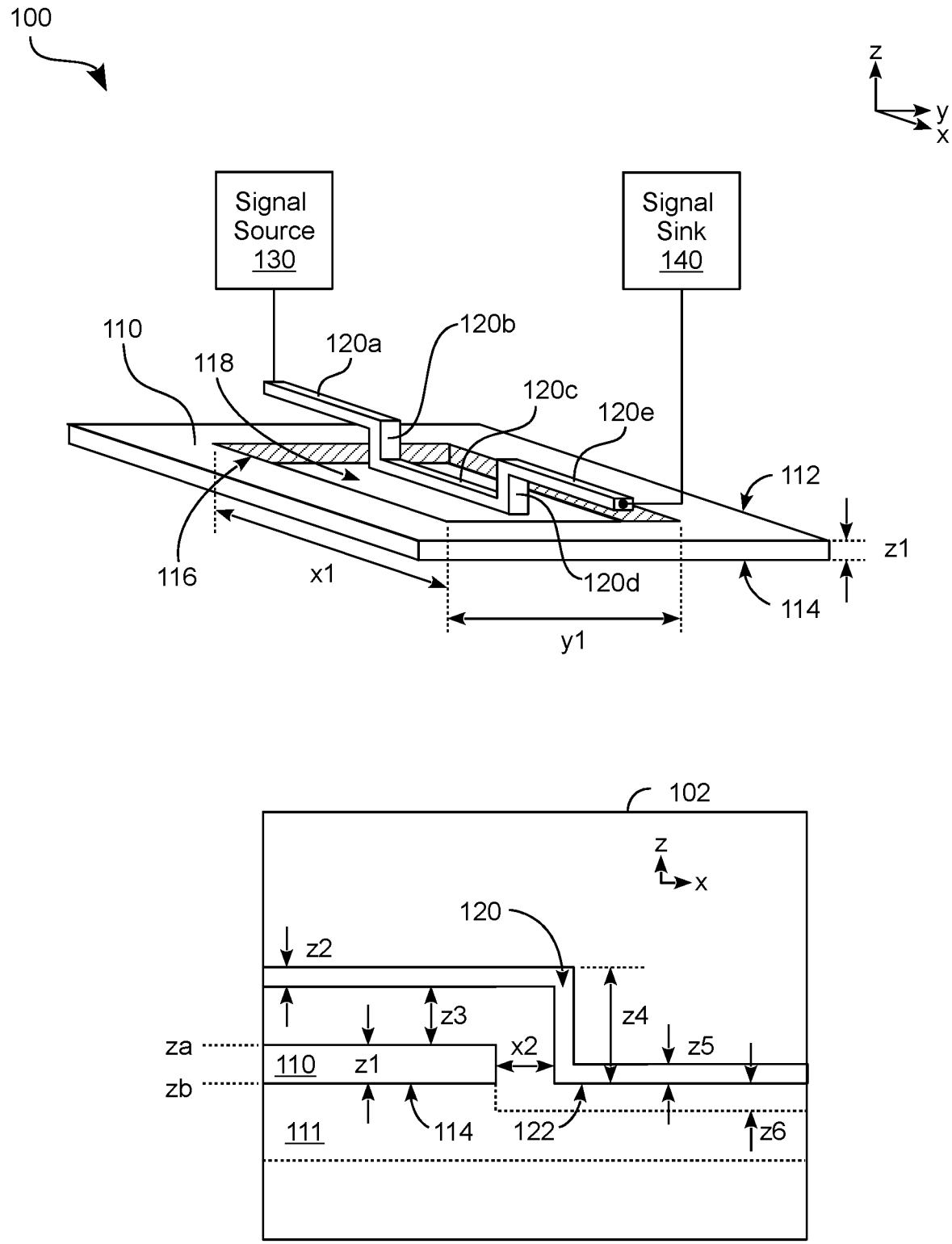
FIG. 1 shows various views each illustrating elements of a system including circuit structures to promote signal integrity according to an embodiment.

FIG. 1 shows features of a system 100 to provide protection of signal integrity according to an embodiment. System 100 is one example of an embodiment that provides an interconnect, portions of which extend above a conductor, wherein at least one vertically undulating structure (referred to herein as a "recess structure" or "recess portion") of the interconnect extends into a hole formed by the conductor. FIG. 1 also includes an inset 102 showing a cross-sectional detail view of system 100.

As shown in FIG. 1, system 100 may include an interconnect 120 and a conductor 110 which forms a hole into which a recess portion of interconnect 120 extends at least partially. Interconnect 120 may include any of a variety of conductors to be coupled to communicate a signal between circuit components—e.g., wherein conductor 110 is configured to provide a reference voltage (or current return path)

during such signal communication by interconnect 120. In an embodiment, system 100 is or includes a substrate comprising conductor 110 and interconnect 120—e.g., wherein a dielectric material (not shown) of the substrate is disposed to provide electrical isolation between conductor 110 and interconnect 120. A printed circuit board of system 100 may include such a substrate, for example. Alternatively, an interposer or other such structure of a packaged device may include such a substrate.

Conductor 110 includes any of a variety of suitable metals—e.g., including copper, aluminum, silver, gold and/or the like—which may be coupled to receive a ground voltage or other reference potential. At least a region of one side of conductor 110 may extend in a first plane—e.g., wherein a side region 112 of conductor 110 extends in the plane za which shown from an edge-wise perspective in the detail view of inset 102. In such an embodiment, another side region 114 of conductor 110—the side region 114 opposite side region 112—may extend in a plane zb which is parallel to, and offset from, the plane za.

Conductor 110 may form a sidewall structure 116 which extends from plane za (e.g., from an edge formed by side region 112) and at least partially toward side region 114. Sidewall 116 may surround, form or otherwise define at least in part a hole 118 which extends at least partially through conductor 110. As illustrated by the cross-sectional view shown in inset 102, hole 118 may extend to a plane zb—e.g., wherein side region 114 extends in plane zb. However, in another embodiment, side region 114 may instead extend in another plane which is below plane zb—e.g., wherein additional material of conductor 110 further extends into a region 111 which is below both plane zb and a bottom side 122 of a portion 120c of interconnect 120.

Interconnect 120 may be another conductor which includes, for example, the same material(s) of conductor 110 and/or one or more other metals suitable to conduct a signal between circuit components (such as the illustrative signal source 130 and signal sink 140 shown). In an embodiment, system 100 includes or is to couple to one or both of signal source 130 and signal sink 140 which, for example, each comprise any of a variety of passive circuit elements, active circuit elements and/or other circuit structures. In some embodiments, one of signal source 130 and signal sink 140 is a connector or other I/O circuitry that is compatible with an interface standard such as that of a USB specification, a Thunderbolt specification or the like. In some embodiments, a total distance along a path formed by interconnect 120, between respective points of connection to signal source 130 and signal sink 140, may be equal to or less than 5.5" (inches)—e.g., wherein the total distance is equal to or less than 3" and, in some embodiments, equal to or less than 2". Alternatively or in addition, signal source 130 and signal sink 140 may be configured to exchange via interconnect 120 a signal at a frequency which is equal to or more than 2 Gigabits per second (Gbps)—e.g., wherein the frequency is at least 5 Gbps and, in some embodiments, at least 10 Gbps. However, some embodiments are not limited to a particular type of functionality provided by signal source 130 and signal sink 140, or by a particular type of signal communicated between signal source 130 and signal sink 140.

To mitigate the effects of signal noise in a communication between signal source 130 and signal sink 140, a recess portion of interconnect 120 may extend at least in part into hole 118. By way of illustration and not limitation, interconnect 120 may include two portions—such as the illustrative portions 120a, 120e shown—which are each disposed over and offset from side 112 (e.g., the offset along a z-axis direction of the xyz coordinate system shown). In such an embodiment, interconnect 120 may further include one or more recess structures variously coupled each between portions 120a, 120e. An example of one such recess portion may be formed, for example, by portions 120b, 120d (e.g., including respective vias) and another portion 120c coupled therebetween. Any electrical connection of interconnect 120 to other circuitry (e.g., to one signal source 130, signal sink 140 or any conductor) may be via a respective portion of the interconnect other than the recess portion.

The recess portion may extend through plane za and at least partially through conductor 110—e.g., wherein one or both of portions 120b, 120d are each a respective via which extends from a metallization layer including one or both of portions 120a, 120e and through a dielectric material at least to (and in some embodiments, through) another layer which includes side region 112. In some embodiments, a bottom side of portion 120c extends below plane za—e.g., wherein the bottom side extends in or below plane zb. Alternatively or in addition, a top side of portion 120c may extend in or below plane za—e.g., wherein the top side is also above plane zb.

As shown in FIG. 1, system 100 may provide a length x1 (a x-axis dimension) of hole 118, a width y1 (a y-axis dimension) of hole 118 and a thickness z1 (z-axis dimension) of conductor 110. Other example dimensions of system 100 include an offset length x2 between sidewall structure 116 and a closest side of portion 120, a thickness z2 of portion 120a, an offset height z3 between side 112 and a bottom side of portion 120a, an overall height z4 of conductor 110, a thickness z5 of portion 120c, and (in some embodiments) an offset height x6 between a bottom side of portion 120c and any underlying portion of conductor 110.

In one embodiment, a substrate of system 100 (the substrate including conductor 110 and interconnect 120) is an interposer or other structure to be included in a packaged device—e.g., wherein the substrate further comprises a bismaleimide-triazine (BT) resin or any of various other dielectrics to provide electrical insulation between conductor 110 and interconnect 120. In such an embodiment, x1 may (for example) be in a range of 0.3 mm to 3 mm—e.g., wherein x2 is in a range of 0.05 mm to 1.5 mm, y1 is in a range of 0.02 mm to 0.1 mm, z1 is in a range of 0.010 mm to 0.040 mm, z2 is in a range of 0.010 mm to 0.040 mm, z3 is in a range of 0.015 mm to 0.040 mm, z4 is in a range of 0.035 mm to 0.12 mm, z5 is in a range of 0.010 mm to 0.040 mm, and/or z6 is greater than or equal to z3. However, such dimensions—some or all of which may vary according to implementation-specific details—are merely illustrative and are not limiting on some embodiments.

Alternatively, such a substrate including conductor 110 and interconnect 120 may be that of a printed circuit board (PCB)—e.g., wherein the substrate further comprises FR4 fiberglass, a polyimide laminate or any of various other dielectrics to provide electrical insulation between conductor 110 and interconnect 120. In such an embodiment, x1 may (for example) be in a range of 50 mils to 300 mils—e.g., wherein x2 is in a range of 2.5 mils to 50 mils, y1 is in a range of 5 mils to 200 mils, z1 is in a range of 0.6 mils to 2 mils, z2 is in a range of 0.6 mils to 2 mils, z3 is in a range of 1.5 mils to 4 mils, z4 is in a range of 2.7 mils to 8 mils, z5 is in a range of 0.6 mils to 2 mils and/or z6 is greater than or equal to z3. However, such dimensions—some or all of which may vary according to implementation-specific details—are merely illustrative and are not limiting on some embodiments.

FIG. 2 shows features of a method 200 to provide functionality to protect the integrity of a signal communication according to an embodiment. Method 200 is one example of processing that fabricates and/or operates circuit structures such as those of system 100, for example.

In some embodiments, method 200 includes operations to fabricate structures (e.g., a substrate) having features such as those of system 100. For example, as shown in FIG. 2, method 200 may include, at 210, forming a conductor including a side region (e.g., side region 112) which extends in a plane. The forming at 210 may include forming a sidewall structure of the conductor, wherein the sidewall structure defines at least in part a hole which extends from the plane and at least partially through the conductor. The hole may extend entirely through the conductor or, in other embodiments, only partially toward an opposite side of the conductor. In an embodiment, forming the conductor at 210 includes any of a variety of additive processes and/or subtractive processes—e.g., including one or more of a plating process, a chemical vapor deposition (CVD) process, a mask and etch process, a laser ablation process or the like—to deposit and/or otherwise form metallization structures. Such processing may be adapted in part from conventional fabrication technologies, for example.

Such fabrication operations of method 200 may further comprise, at 220, forming an interconnect comprising a first portion, a second portion and a recess portion extending between the first portion and the second portion. Forming of the interconnect at 220 may include a dielectric material lamination process, additive processes and/or subtractive processes (such as a laser ablation) which, for example, are similar to those used in the forming at 210. The first portion and the second portion may each be disposed above the plane (e.g., plane za shown at inset 102) and offset from the side region, wherein the recess portion extends through the plane and into the hole. Formation of at least a portion of the interconnect at 220 (e.g., including formation of portion 120c, for example) may be concurrent with the forming of the conductor at 210. In an embodiment, any electrical connection of the interconnect to a circuit element is via a respective portion of the interconnect other than the recess portion.

Although some embodiments are not limited in this regard, forming the conductor may further comprise forming a second sidewall structure of the conductor, wherein the second sidewall structure defines at least in part a second hole which also extends from the plane and at least partially through the conductor. In such an embodiment, forming the interconnect at 220 may further comprise a third portion and a second recess portion each of the interconnect, wherein the third portion is disposed above the plane and offset from the side region. The second recess portion may extend between the second portion and the third portion—e.g., wherein the second recess portion extends through the plane and into the second hole, and any electrical connection of the interconnect to a circuit element is via a respective portion of the interconnect other than the second recess portion.

In some embodiments, method 200 may additionally or alternatively include, at 230, coupling the interconnect between a first circuit and a second circuit—e.g., wherein, with respect to signal communication via the interconnect, the first circuit and the second circuit are to function each as a different respective one of a signal source and a signal sink. One or both of first circuit and the second circuit may each be included in—or alternatively, coupled to—a substrate which includes the conductor and the interconnect. A package mold may be deposited on such a substrate by additional, packaging operations of method 200. Coupling of the first circuit and/or the second circuit to one or both of the conductor and the interconnect may be accomplished through surface mounting process (e.g., solder reflow, metal diffusion or the like) of one or more semiconductor dies on a package substrate or—alternatively—of one or more packaged semiconductor devices on a PCB.

In some embodiments, method 200 additionally or alternatively includes processes to operate a substrate or other device such as one which is fabricated according to processes 210, 220, 230. For example, method 200 may comprise (at 240) providing a reference potential with the conductor and (at 250) communicating a signal, while the reference potential is provided with the conductor, between the first circuit and the second circuit via the interconnect.

Communicating the signal via the interconnect at 250 may comprise providing a single-ended communication with the interconnect. Alternatively, communicating the signal may comprise providing, with the interconnect, a first signal of a differential signal pair. For example, method 200 may further comprise additional processing (not shown) which provides a second signal of the differential signal pair with another interconnect. In such an embodiment, the other interconnect may similarly comprise a second recess portion which also extends from the plane and into the hole.

In some embodiments, the conductor may further comprise a second sidewall structure which defines at least in part a second hole which, similar to the hole formed at 210, extends from the plane and at least partially through the conductor. In one such embodiment, additional operations (not shown) of method 200 further comprise communicating another signal with another interconnect of the substrate. This other interconnect may comprise a second recess portion which (similar to the recess portion of the interconnect formed at 220) extends from the plane and into the second hole—e.g., wherein any electrical connection of the other interconnect to a circuit element is via a respective portion of the other interconnect other than the second recess portion. Both of these interconnects may each extend both into the first hole and into the second hole, in some embodiments. Along a given dimension, a first span of a portion of the conductor may be between a second span of a first hole and a third span of the second hole, wherein the first span, the second span and the third span each extend along the dimension. In such an embodiment, the interconnect may be configured to communicate the signal at 250 across the second span of the first hole.

Figure 3:
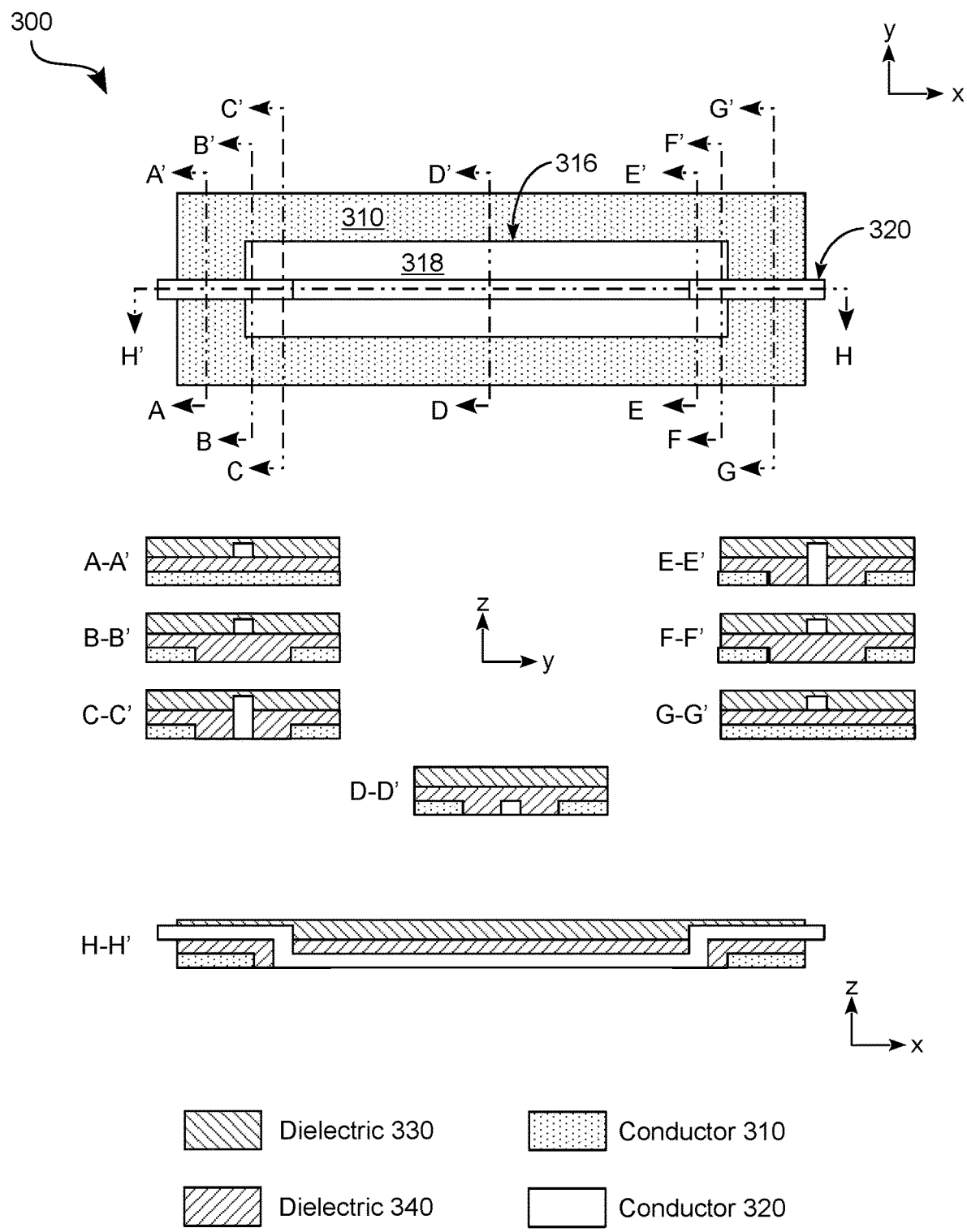
FIG. 3 shows cross-sectional side views of a circuit device to interconnect a signal source and a signal sink according to an embodiment.

FIG. 3 shows features of a substrate 300 to protect the integrity of signal communications according to an embodiment. Substrate 300 is one example of an embodiment that provides and/or utilizes—e.g., according to one or more processes of method 200—an arrangement of a conductor and an interconnect, where a portion of the interconnect extends into a hole formed by the conductor. Substrate 300 may include some or all of the features of system 100, for example.

As shown in FIG. 3, substrate 300 may include a conductors 310, 320 (where conductor 320 is to function as an interconnect), wherein a sidewall structure 316 of conductor 310 forms a hole 318 that extends at least partially through conductor 310. Two portions of interconnect 320 may extend over, and be vertically offset from, a side of conductor 310. In such an embodiment, one or more recess portions of interconnect 320 (each extending at least in part between the two other portions of interconnect 320) may extend at least partially into the hole.

To illustrate structures of substrate 300, FIG. 3 also illustrates views of cross-sections A-A', B-B', C-C', D-D', E-E', F-F' and G-G' each in a respective y-z plane of the xyz coordinate system shown. FIG. 3 also illustrates a cross-section H-H' in a x-z plane of the xyz coordinate system. As shown in these various cross-sections, a dielectric 340 may provide at least some electrical insulation between conductor 310 and interconnect 320. Dielectric 340 may include any of a variety of insulator materials used, for example, in conventional printed circuit boards, interposers or the like. Examples materials of dielectric 340 include FR4 fiberglass, a polyimide compound, a BT resin, etc. In some embodiments, substrate 300 further comprises one or more additional layers—e.g., including another layer of a dielectric 330—which, for example, provide additional conductive paths, additional electrical insulation of interconnect 320 and/or the like.

FIG. 4A shows devices 400, 430 each to provide respective signal protection functionality according to a corresponding embodiment. Devices 400, 430 are examples embodiments that variously provide—e.g., according to processes of method 200—an arrangement of a conductor and an interconnect, where a portion of the interconnect extends into a hole formed by the conductor. One or each of devices 400, 430 may include some or all of the features of system 100, for example.

As shown in FIG. 4A, device 400 includes an interconnect 420 and a conductor 410, a sidewall structure 416 of which forms a hole 418 that extends at least partially through conductor 410. Hole 418 may extend from a side region 412 of conductor 410 and at least partially toward an opposite side region 414 of conductor 410. Interconnect 420 is one example of an interconnect including multiple recess portions which each extend into a respective hole of one or more holes formed by a reference voltage conductor. In the embodiment shown, interconnect 420 includes portions 420a, 420e, 420i which are each disposed over, and offset vertically from, side region 412. A first recess portion of interconnect 420 may extend between portions 420a, 420e—e.g., the first recess portion formed by the illustrative portions 420b, 420c, 420d shown. Similarly, a second recess portion of interconnect 420 may extend between portions 420e, 420i—e.g., the second recess portion formed by the illustrative portions 420f, 420g, 420h shown. As also described herein, two recess portions of a given interconnect may instead extend each into a different respective hole formed by a conductor.

Device 430 illustrates another embodiment wherein multiple recess portions, each of a different respective interconnect, variously extend each at least partially into the same hole which is formed by a reference voltage conductor. For example, device 430 may include interconnects 450, 452 and a conductor 440, a sidewall structure 446 of which forms a hole that extends from a side region 442 of conductor 440 and at least partially toward an opposite side region 444 of conductor 440. In such an embodiment, interconnects 450, 452 may each include a respective two portions which are each disposed over, and offset vertically from, side region 442. Additionally, interconnects 450, 452 may each include a respective recess portion which extend past a plane in which side region 442 extends. Interconnects 450, 452 may be coupled to communicate different respective signals of a differential pair, for example.

FIG. 4B shows another device 460 to provide signal protection functionality according to an embodiment. Device 460 may include some or all of the features of system 100, for example. As shown in FIG. 4B, device 460 includes interconnects 480, 482 and a conductor 470, a sidewall structure 476 of which defines at least in part a first hole that extends from a side region 472 of conductor 470 and at least partially toward an opposite side region 474 of conductor 470. Moreover, another sidewall structure 478 of conductor 470 may define at least in part a second hole that extends from side region 472 and at least partially through conductor 470. For example, a portion 490 of conductor 470 may be disposed between the first and second hole—e.g., at least along the x-axis dimension shown. In such an embodiment, interconnects 480, 482 may each include a respective three or more portions which are each disposed over, and offset vertically from, side region 472. For example, FIG. 4B also includes an inset 461 which shows a cross-sectional view of device 460 in a x-z plane of a xyz coordinate system. As shown in inset 461, interconnect 480 includes portions 480a, 480c, 480e which each extend over side 472.

Additionally, interconnects 480, 482 may each include two recess portions which each extend into a different respective one of the first hole and second hole variously formed by sidewall structures 476, 478. For example, interconnect 480 may further comprise a first recess portion 480b which couples portions 480a, 480c to each other, wherein the first recess portion 480b extends through the plane which includes side region 472. Moreover, interconnect 480 may also comprise a second recess portion 480d which couples portions 480c, 480e to each other, wherein the second recess portion 480d extends through the plane of side region 472. Interconnects 480, 482 may be coupled to communicate different respective signals of a differential pair, for example.

In the example embodiment shown, electrical insulation of interconnects 480, 482 and conductor 470 from one another may be provided at least in part with a dielectric 464 disposed therebetween. Device 460 may further comprise one or more other layers—e.g., including a layer 462 of a solder mask, dielectric and/or other material to facilitate processing to further make or use device 460.

FIG. 5 shows other devices 500, 530 which are each to provide respective signal protection functionality according to a corresponding embodiment. Devices 500, 530 show various arrangements each of a respective two holes formed by a given reference voltage conductor.

For example, device 500 may include interconnects 520a, 520b, 520c, 520d and a conductor 510 having holes 518a, 518b formed therein. Respective portions of interconnects 520a, 520b, 520c, 520d may variously extend over a side of conductor 510. In such an embodiment, interconnects 520a, 520b further comprise respective recess portions which each extend at least partially into hole 518a. Similarly, interconnects 520c, 520d may further comprise respective recess portions which each extend at least partially into hole 518b. For example, the arrangement of interconnects 520a, 520b relative to hole 518a (and/or the arrangement of interconnects 520c, 520d relative to hole 518b) may include features of device 430. In such an embodiment, holes 518a, 518b may overlap one another at least along a line of direction—e.g., along the x-axis shown—which some or all of interconnects 520a, 520b, 520c, 520d are each to communicate a respective signal. For example, in a region x_a extending along the x-axis, a span of hole 518a may overlap—e.g., entirely or at least in part—a span of hole 518b (the spans each along the x-axis).

In another embodiment, device 530 includes interconnects 550a, 550b, 550c, 550d and a conductor 540 having holes 548a, 548b formed therein. Respective portions of interconnects 550a, 550b, 550c, 550d may variously extend over a side of conductor 540—e.g., wherein interconnects 550a, 550b further comprise respective recess portions which each extend at least partially into hole 548a. Similarly, interconnects 550c, 550d may further comprise respective recess portions which each extend at least partially into hole 548b. In such an embodiment, holes 548a, 548b may be offset from one another at least along a line of direction—e.g., along the x-axis shown—which some or all of interconnects 550a, 550b, 550c, 550d are each to communicate a respective signal. For example, in a region x_b extending along the x-dimension shown, a span of a portion of conductor 540 may be located between a span of hole 548a and a span of hole 548b (the spans each along the x-axis).

Figure 6:
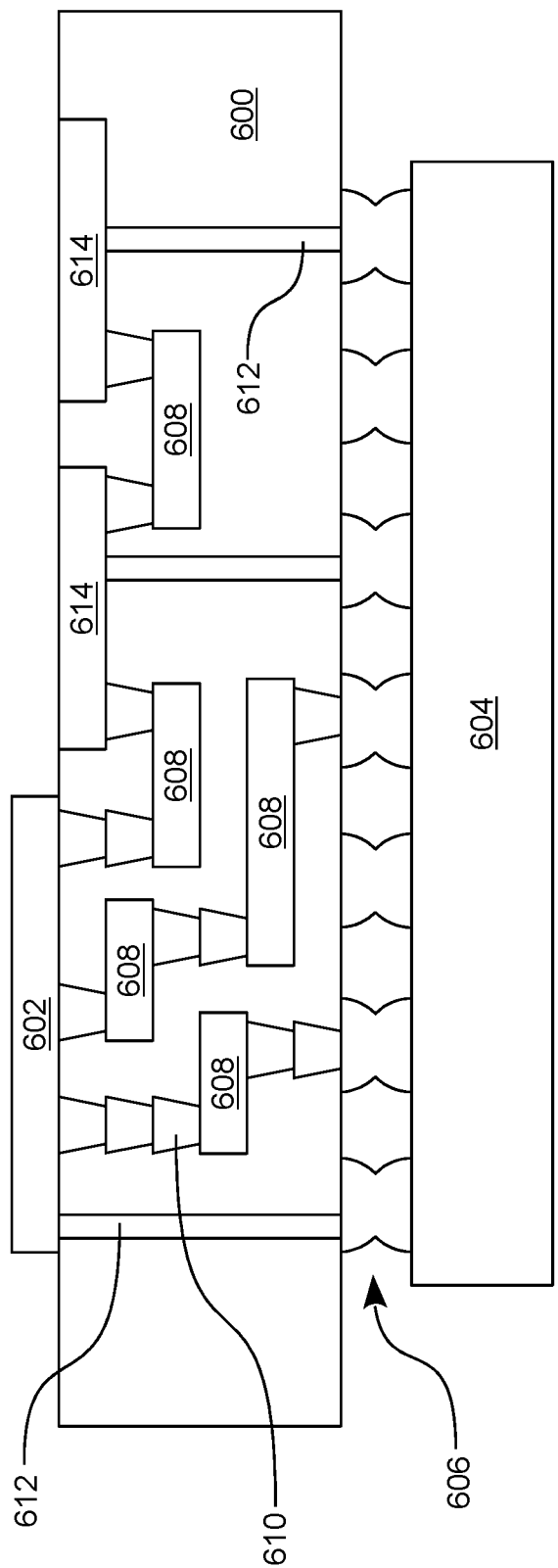
FIG. 6 is a cross-sectional view of an interposer implementing one or more embodiments.

FIG. 6 illustrates an interposer 600 that includes one or more embodiments. Conductive structures of interconnect 600 may include features of system 100 or substrate 300 or one of devices 400, 430, 460, 500, 530, for example. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602, 604 are attached to opposing sides of the interposer 600. In other embodiments, the first and second substrates 602, 604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with some embodiments, apparatuses or processes disclosed herein may be used in the fabrication of interposer 600.

Figure 7:
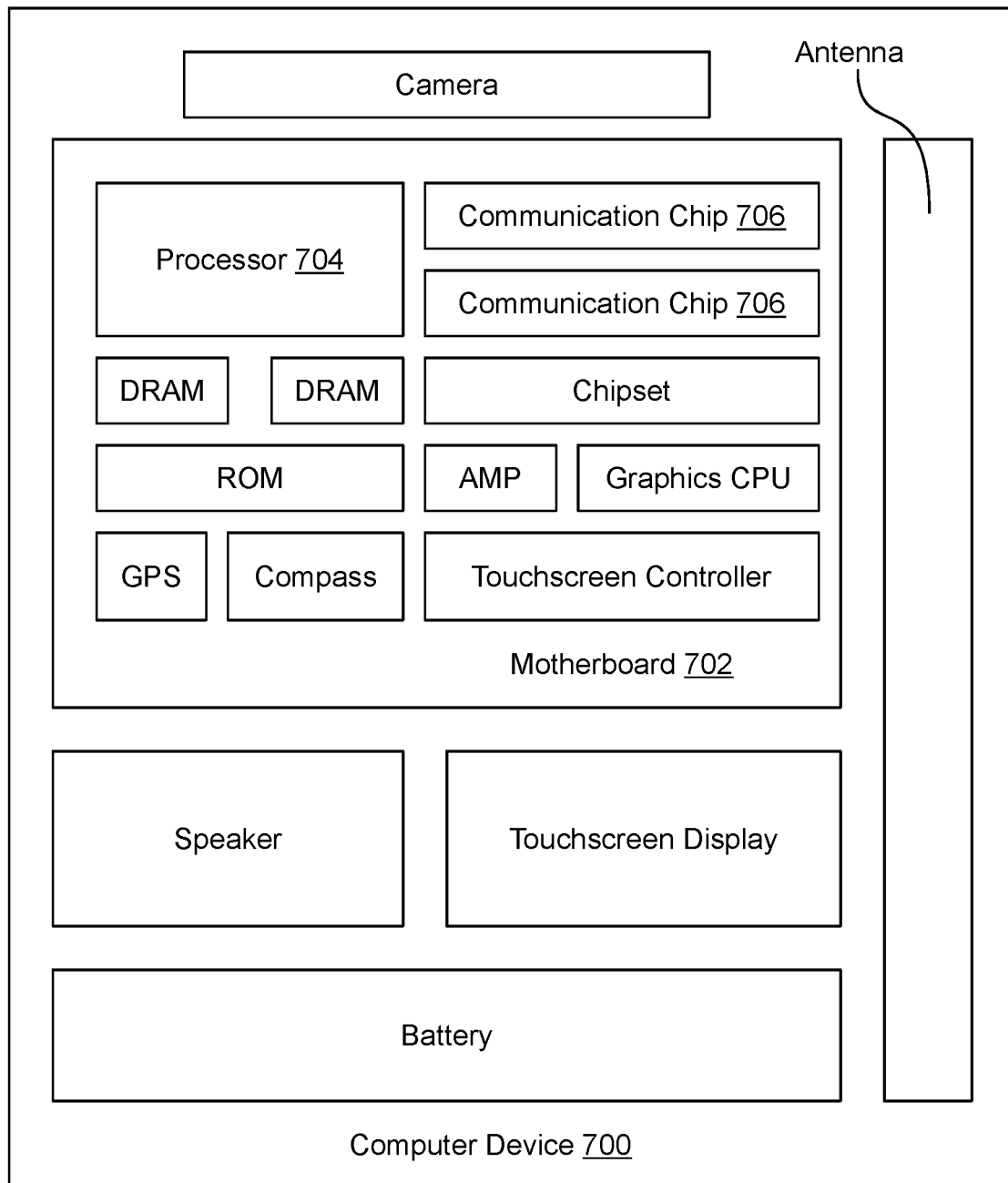
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
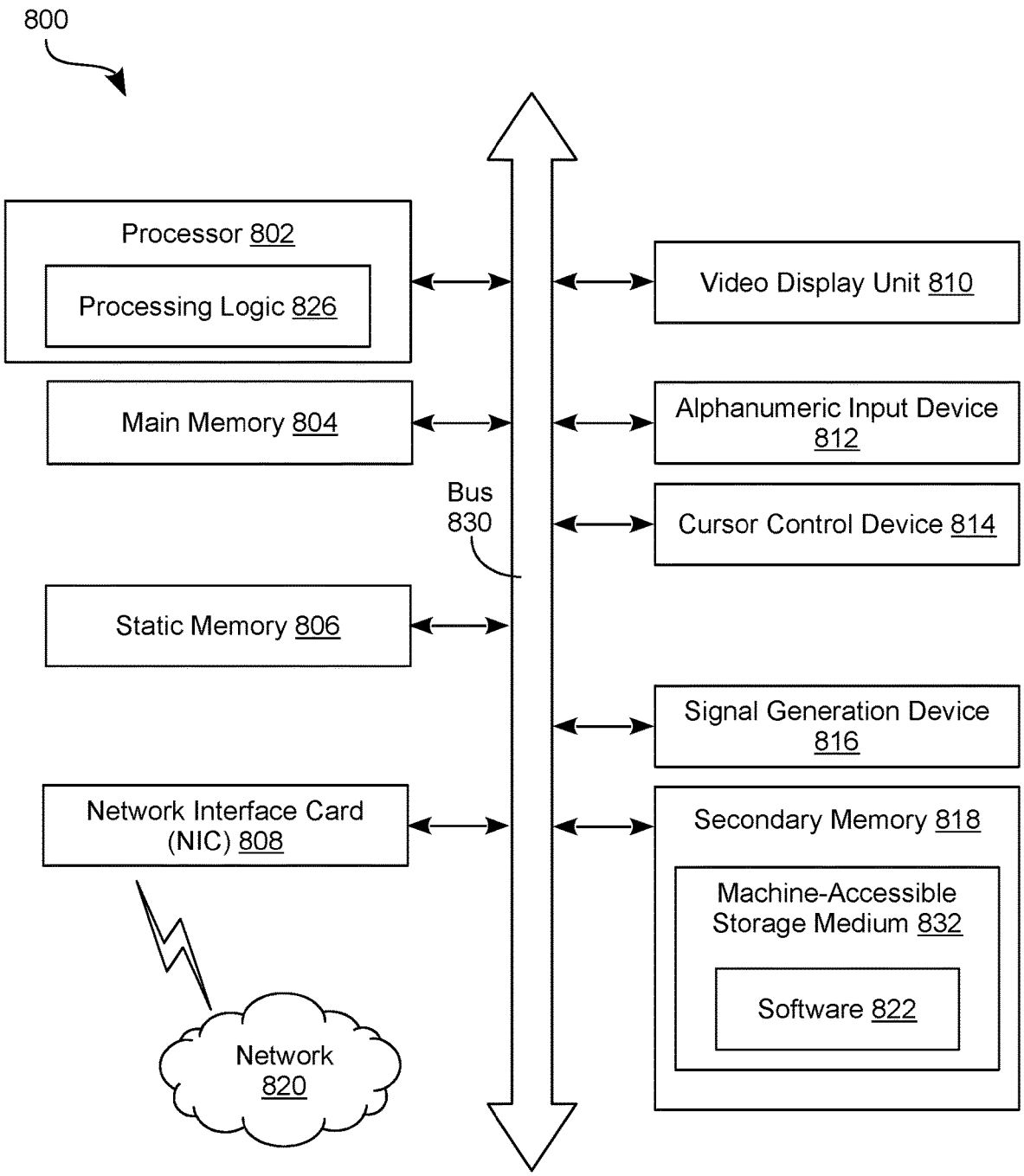
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Example 1 is a circuit device for mitigating loss of signal integrity, the circuit device comprising a substrate comprising a conductor comprising a side region which extends in a plane, and a sidewall structure which defines at least in part a hole which extends from the plane and at least partially through the conductor, and an interconnect to communicate a signal between a first circuit and a second circuit while the conductor provides a reference potential. The interconnect comprises a first portion and a second portion each disposed above the plane and offset from the side region, and a recess portion, between the first portion and the second portion, which extends through the plane and into the hole, wherein any electrical connection of the interconnect to a circuit element is via a respective portion of the interconnect other than the recess portion.

In Example 2, the subject matter of Example 1 optionally includes wherein the hole extends entirely through the conductor.

In Example 3, the subject matter of Example 1 optionally includes wherein the hole extends only partially toward another side region of the conductor.

In Example 4, the subject matter of any one or more of Examples 1 through 3 optionally includes wherein the interconnect to communicate the signal comprises the interconnect to provide a single-ended communication.

In Example 5, the subject matter of any one or more of Examples 1 through 3 optionally includes wherein the interconnect to communicate the signal comprises the interconnect to provide a first signal of a differential signal pair.

In Example 6, the subject matter of Example 5 optionally includes the circuit device further comprising another interconnect to provide a second signal of the differential signal pair, wherein the recess portion of the interconnect comprises a first recess portion, and wherein the other interconnect comprises a second recess portion which extends from the plane and into the hole.

In Example 7, the subject matter of any one or more of Examples 1 through 3 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor. The interconnect further comprises a third portion disposed above the plane and offset from the side region, and a second recess portion, between the second portion and the third portion, which extends through the plane and into the second hole, wherein any electrical connection of the interconnect to a circuit element is via a respective portion of the interconnect other than the second recess portion.

In Example 8, the subject matter of any one or more of Examples 1 through 3 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor, and wherein the device further comprises another interconnect to communicate another signal, wherein the other interconnect comprises a second recess portion which extends from the plane and into the second hole, wherein any electrical connection of the other interconnect to a circuit element is via a respective portion of the other interconnect other than the second recess portion.

In Example 9, the subject matter of Example 8 optionally includes wherein the interconnect and the other interconnect each extend both into the first hole and into the second hole.

In Example 10, the subject matter of Example 8 optionally includes wherein, along a dimension, a first span of a portion of the conductor is between a second span of the first hole and a third span of the second hole, wherein the first span, the second span and the third span are each along the dimension.

Example 11 is a method at a substrate for mitigating loss of signal integrity, the method comprising providing a reference potential with a conductor comprising a side region which extends in a plane, wherein a sidewall structure of the conductor defines at least in part a hole which extends from the plane and at least partially through the conductor, and while the reference potential is provided with the conductor, communicating a signal between a first circuit and a second circuit via an interconnect comprising a first portion and a second portion each disposed above the plane and offset from the side region, and a recess portion, between the first portion and the second portion, which extends through the plane and into the hole, wherein any electrical connection of the interconnect to a circuit element is via a respective portion of the interconnect other than the recess portion.

In Example 12, the subject matter of Example 11 optionally includes wherein the hole extends entirely through the conductor.

In Example 13, the subject matter of Example 11 optionally includes wherein the hole extends only partially toward a second side of the conductor, the second side opposite the first side.

In Example 14, the subject matter of any one or more of Examples 11 through 13 optionally includes wherein communicating the signal via the interconnect comprises providing a single-ended communication with the interconnect.

In Example 15, the subject matter of any one or more of Examples 11 through 13 optionally includes wherein communicating the signal via the interconnect comprises providing, with the interconnect, a first signal of a differential signal pair.

In Example 16, the subject matter of Example 15 optionally includes the method further comprising providing a second signal of the differential signal pair with another interconnect, wherein the recess portion of the interconnect comprises a first recess portion, and wherein the other interconnect comprises a second recess portion which extends from the plane and into the hole.

In Example 17, the subject matter of any one or more of Examples 11 through 13 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor, and wherein the interconnect further comprises a third portion disposed above the plane and offset from the side region, and a second recess portion, between the second portion and the third portion, which extends through the plane and into the second hole, wherein any electrical connection of the interconnect to a circuit element is via a respective portion of the interconnect other than the second recess portion.

In Example 18, the subject matter of any one or more of Examples 11 through 13 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor, and the method further comprising communicating another signal with another interconnect comprising a second recess portion which extends from the plane and into the second hole, wherein any electrical connection of the other interconnect to a circuit element is via a respective portion of the other interconnect other than the second recess portion.

In Example 19, the subject matter of Example 18 optionally includes wherein the interconnect and the other interconnect each extend both into the first hole and into the second hole.

In Example 20, the subject matter of Example 18 optionally includes wherein, along a dimension, a first span of a portion of the conductor is between a second span of the first hole and a third span of the second hole, wherein the first span, the second span and the third span are each along the dimension.

Example 21 is a system for mitigating loss of signal integrity, the system comprising a substrate comprising a conductor comprising a side region which extends in a plane, and a sidewall structure which defines at least in part a hole which extends from the plane and at least partially through the conductor. The substrate further comprises an interconnect to communicate a signal between a first circuit and a second circuit while the conductor provides a reference potential, wherein the interconnect comprises a first portion and a second portion each disposed above the plane and offset from the side region, and a recess portion, between the first portion and the second portion, which extends through the plane and into the hole, wherein any electrical connection of the interconnect to a circuit element is via a respective portion of the interconnect other than the recess portion. The system further comprises a display device coupled to the substrate, the display device to display an image based on the signal.

In Example 22, the subject matter of Example 21 optionally includes wherein the hole extends entirely through the conductor.

In Example 23, the subject matter of Example 21 optionally includes wherein the hole extends only partially toward another side region of the conductor.

In Example 24, the subject matter of any one or more of Examples 21 through 23 optionally includes wherein the interconnect to communicate the signal comprises the interconnect to provide a single-ended communication.

In Example 25, the subject matter of any one or more of Examples 21 through 23 optionally includes wherein the interconnect to communicate the signal comprises the interconnect to provide a first signal of a differential signal pair.

In Example 26, the subject matter of Example 25 optionally includes the substrate further comprising another interconnect to provide a second signal of the differential signal pair, wherein the recess portion of the interconnect comprises a first recess portion, and wherein the other interconnect comprises a second recess portion which extends from the plane and into the hole.

In Example 27, the subject matter of any one or more of Examples 21 through 23 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor, and wherein the interconnect further comprises a third portion disposed above the plane and offset from the side region, and a second recess portion, between the second portion and the third portion, which extends through the plane and into the second hole, wherein any electrical connection of the interconnect to a circuit element is via a respective portion of the interconnect other than the second recess portion.

In Example 28, the subject matter of any one or more of Examples 21 through 23 optionally includes wherein the sidewall structure, the hole and the recess portion comprise, respectively, a first sidewall structure, a first hole and a first recess portion, wherein the conductor further comprises a second sidewall structure which defines at least in part a second hole which extends from the plane and at least partially through the conductor, and wherein the substrate further comprises another interconnect to communicate another signal, wherein the other interconnect comprises a second recess portion which extends from the plane and into the second hole, wherein any electrical connection of the other interconnect to a circuit element is via a respective portion of the other interconnect other than the second recess portion.

In Example 29, the subject matter of Example 28 optionally includes wherein the interconnect and the other interconnect each extend both into the first hole and into the second hole.

In Example 30, the subject matter of Example 28 optionally includes wherein, along a dimension, a first span of a portion of the conductor is between a second span of the first hole and a third span of the second hole, wherein the first span, the second span and the third span are each along the dimension.

Techniques and architectures for providing interconnect structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. A circuit device for mitigating loss of signal integrity, the circuit device comprising:
   a substrate comprising:
     a conductor comprising:
       a side region which extends in a plane; and
       a sidewall structure which defines at least in part a hole which extends from the plane and at least partially through the conductor; and an interconnect to communicate a signal between a first circuit and a second circuit while the conductor provides a reference potential, wherein the interconnect comprises:
a first portion and a second portion each disposed above the plane and offset from the side region; and
a third portion which extends between, and to each of, the first portion and the second portion, the third portion comprising a recess portion which extends through the plane and into the hole, wherein from the first portion to the second portion, one or more dielectrics layers are adjacent to the third portion to provide an electrical insulation along an entire length of the third portion, wherein the third portion is directly coupled electrically to only the first portion and the second portion.

2. The circuit device of claim 1, wherein the hole extends entirely through the conductor.

3. The circuit device of claim 1, wherein the hole extends only partially toward another side region of the conductor.

4. The circuit device of claim 1, wherein the interconnect to communicate the signal comprises the interconnect to provide a single-ended communication.

5. The circuit device of claim 1, wherein the interconnect to communicate the signal comprises the interconnect to provide a first signal of a differential signal pair.

6. The circuit device of claim 5, further comprising another interconnect to provide a second signal of the differential signal pair, wherein the recess portion of the interconnect comprises a first recess portion, and wherein the other interconnect comprises a second recess portion which extends from the plane and into the hole.

7. The circuit device of claim 1, wherein the sidewall structure, the hole and the recess portion comprise, respectively, a first sidewall structure, a first hole and a first recess portion;
wherein the conductor further comprises a second sidewall structure which defines at least in part a second hole which extends from the plane and at least partially through the conductor; and
wherein the third portion further comprises:
a second recess portion, between the second portion and the first recess portion, which extends through the plane and into the second hole.

8. The circuit device of claim 1, wherein the sidewall structure, the hole and the recess portion comprise, respectively, a first sidewall structure, a first hole and a first recess portion;
wherein the conductor further comprises a second sidewall structure which defines at least in part a second hole which extends from the plane and at least partially through the conductor; and
wherein the device further comprises another interconnect to communicate another signal, wherein the other interconnect comprises a second recess portion which extends from the plane and into the second hole, wherein any electrical connection of the other interconnect to a circuit element is via a respective portion of the other interconnect other than the second recess portion.

9. The circuit device of claim 8, wherein the interconnect and the other interconnect each extend both into the first hole and into the second hole.

10. The circuit device of claim 8, wherein, along a dimension, a first span of a portion of the conductor is between a second span of the first hole and a third span of the second hole, wherein the first span, the second span and the third span are each along the dimension.

11. A method at a substrate for mitigating loss of signal integrity, the method comprising:
providing a reference potential with a conductor comprising a side region which extends in a plane, wherein a sidewall structure of the conductor defines at least in part a hole which extends from the plane and at least partially through the conductor; and
while the reference potential is provided with the conductor, communicating a signal between a first circuit and a second circuit via an interconnect comprising:
a first portion and a second portion each disposed above the plane and offset from the side region; and
a third portion which extends between, and to each of, the first portion and the second portion, the third portion comprising a recess portion which extends through the plane and into the hole, wherein, from the first portion to the second portion, one or more dielectrics layers are adjacent to the third portion to provide an electrical insulation along an entire length of the third portion, wherein the third portion is directly coupled electrically to only the first portion and the second portion.

12. The method of claim 11, wherein the hole extends entirely through the conductor.

13. The method of claim 11, wherein the hole extends only partially toward a second side of the conductor, the second side opposite the first side.

14. The method of claim 11, wherein communicating the signal via the interconnect comprises providing a single-ended communication with the interconnect.

15. The method of claim 11, wherein communicating the signal via the interconnect comprises providing, with the interconnect, a first signal of a differential signal pair.

16. The method of claim 15, further comprising:
providing a second signal of the differential signal pair with another interconnect, wherein the recess portion of the interconnect comprises a first recess portion, and wherein the other interconnect comprises a second recess portion which extends from the plane and into the hole.

17. The method of claim 11, wherein the sidewall structure, the hole and the recess portion comprise, respectively, a first sidewall structure, a first hole and a first recess portion;
wherein the conductor further comprises a second sidewall structure which defines at least in part a second hole which extends from the plane and at least partially through the conductor; and
wherein the third portion further comprises:
a second recess portion, between the second portion and the first recess portion, which extends through the plane and into the second hole.

18. The method of claim 11, wherein the sidewall structure, the hole and the recess portion comprise, respectively, a first sidewall structure, a first hole and a first recess portion;
wherein the conductor further comprises a second sidewall structure which defines at least in part a second hole which extends from the plane and at least partially through the conductor; and
the method further comprising:
communicating another signal with another interconnect comprising a second recess portion which extends from the plane and into the second hole, wherein any electrical connection of the other interconnect to a circuit element is via a respective portion of the other interconnect other than the second recess portion.

19. The method of claim 18, wherein the interconnect and the other interconnect each extend both into the first hole and into the second hole.

20. The method of claim 18, wherein, along a dimension, a first span of a portion of the conductor is between a second span of the first hole and a third span of the second hole, wherein the first span, the second span and the third span are each along the dimension.

21. A system for mitigating loss of signal integrity, the system comprising
a substrate comprising:
a conductor comprising:
a side region which extends in a plane; and
a sidewall structure which defines at least in part a hole which extends from the plane and at least partially through the conductor; and
an interconnect to communicate a signal between a first circuit and a second circuit while the conductor provides a reference potential, wherein the interconnect comprises:
a first portion and a second portion each disposed above the plane and offset from the side region; and
a third portion which extends between, and to each of, the first portion and the second portion, the third portion comprising a recess portion which extends through the plane and into the hole, wherein, from the first portion to the second portion, one or more dielectrics layers are adjacent to the third portion to provide an electrical insulation along an entire length of the third portion,
wherein the third portion is directly coupled electrically to only the first portion and the second portion; and
a display device coupled to the substrate, the display device to display an image based on the signal.

22. The system of claim 21, wherein the hole extends entirely through the conductor.

23. The system of claim 21, wherein the hole extends only partially toward another side region of the conductor.

24. The system of claim 21, wherein the interconnect to communicate the signal comprises the interconnect to provide a single-ended communication.

25. The system of claim 21, wherein the interconnect to communicate the signal comprises the interconnect to provide a first signal of a differential signal pair.

* * * * *